United States Patent
Lv et al.

(10) Patent No.: US 10,466,584 B2
(45) Date of Patent: Nov. 5, 2019

(54) PHOTOETCHING MASK PLATE, MANUFACTURE METHOD THEREOF, AND PHOTOETCHING METHOD

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhenhua Lv, Beijing (CN); Xi Chen, Beijing (CN); Shijun Wang, Beijing (CN); Zhiying Bao, Beijing (CN); Yong Zhang, Beijing (CN); Yue Li, Beijing (CN); Wenjun Xiao, Beijing (CN); Yanna Xue, Beijing (CN); Wenbo Jiang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/533,456

(22) PCT Filed: Jan. 11, 2017

(86) PCT No.: PCT/CN2017/070816
§ 371 (c)(1),
(2) Date: Jun. 6, 2017

(87) PCT Pub. No.: WO2017/197915
PCT Pub. Date: Nov. 23, 2017

(65) Prior Publication Data
US 2019/0094681 A1 Mar. 28, 2019

(30) Foreign Application Priority Data
May 18, 2016 (CN) .......................... 2016 1 0329420

(51) Int. Cl.
*G03F 1/40* (2012.01)
*H01L 27/12* (2006.01)

(52) U.S. Cl.
CPC ............ *G03F 1/40* (2013.01); *H01L 27/1288* (2013.01)

(58) Field of Classification Search
CPC ........................................................ G03F 1/40
USPC .............................................................. 430/5
See application file for complete search history.

(56) References Cited

U.S. PATENT DOCUMENTS

| | | | |
|---|---|---|---|
| 9,383,639 B2 * | 7/2016 | Kim | ........................ G03F 1/40 |
| 2006/0154153 A1 | 7/2006 | Chiang et al. | |
| 2015/0293440 A1 | 10/2015 | Kim et al. | |

FOREIGN PATENT DOCUMENTS

| | | |
|---|---|---|
| CN | 101441408 A | 5/2009 |
| CN | 203164592 U | 8/2013 |
| CN | 103941540 A | 7/2014 |
| CN | 203759422 U | 8/2014 |
| CN | 204374607 U | 6/2015 |
| CN | 105759562 A | 7/2016 |
| JP | 2003248294 A | 9/2003 |
| KR | 20130044393 A | 5/2013 |
| TW | 200625000 A | 7/2006 |

OTHER PUBLICATIONS

International Search Report and Written Opinion for Application No. PCT/CN2017/070816, dated Mar. 30, 2017, 12 Pages.
First Office Action for Chinese Application No. 201610329420.3, dated Mar. 5, 2019, 11 Pages.

* cited by examiner

*Primary Examiner* — Christopher G Young
(74) *Attorney, Agent, or Firm* — Brooks Kushman P.C.

(57) ABSTRACT

The present disclosure provides a photoetching mask plate, a method for manufacturing the photoetching mask plate, and a photoetching method using the photoetching mask plate. The photoetching mask plate includes a base substrate, a mask pattern arranged on a surface of the base substrate, and a conductive connection pattern arranged on the surface of the base substrate. The conductive connection pattern is configured to electrically connect separate portions of the mask pattern to each other.

20 Claims, 3 Drawing Sheets

PHOTOETCHING MASK PLATE, MANUFACTURE METHOD THEREOF, AND PHOTOETCHING METHOD

CROSS-REFERENCE TO RELATED APPLICATIONS

This application is the U.S. national phase of PCT Application No. PCT/CN2017/070816 filed on Jan. 11, 2017, which claims priority to Chinese Patent Application No. 201610329420.3 filed on May 18, 2016, the disclosures of which are incorporated in their entirety by reference herein.

TECHNICAL FIELD

The present disclosure relates to the field of display technology, in particular to a photoetching mask plate, a photoetching method using the photoetching mask plate, and a method for manufacturing the photoetching mask plate.

BACKGROUND

During manufacturing a display panel, usually a photoetching processing is adopted to form pattern layers on the display panel. During the manufacture, testing and transportation of a photoetching mask plate to be used in the photoetching process, electrostatic charges may inevitably be introduced. For the photoetching mask plate, its base substrate is usually made of an organic material, e.g., an insulative glass substrate, so the release of the electrostatic charges may be adversely affected. In the case that the electrostatic charges are accumulated on the photoetching mask plate to a certain extent, electrostatic discharge (ESD) may probably occur between separate portions of a mask pattern on the photoetching mask plate. Once the ESD occurs during the photoetching procedure, the performance of a semiconductor layer or a metal line on the display panel may be degraded or even the semiconductor layer or metal line may be damaged due to a high voltage or current generated instantaneously, and thereby the performance of the resultant display panel and the yield thereof may be seriously affected.

Hence, there is an urgent need in the art to provide an improved photoetching mask plate, a photoetching method using the photoetching mask plate, and a method for manufacturing the photoetching mask plate.

SUMMARY

An object of the present disclosure is to provide a photoetching mask plate, a photoetching method using the photoetching mask plate, and a method for manufacturing the photoetching mask plate, so as to at least partially overcome the above-mentioned drawbacks.

In one aspect, the present disclosure provides in some embodiments a photoetching mask plate, including a base substrate, a mask pattern arranged at a surface of the base substrate, and a conductive connection pattern arranged at the surface of the base substrate. The conductive connection pattern is configured to electrically connect separate portions of the mask pattern to each other.

In the context, the term "surface" refers to a surface of the base substrate where the mask pattern and the conductive connection pattern are to be formed, and it is unnecessarily an exposed surface of the photoetching mask plate. For example, the photoetching mask plate may further include a packaging layer for packaging the base substrate, the mask pattern and the conductive connection pattern on the base substrate, to prevent the mask pattern and the conductive connection pattern from being damaged.

According to the embodiments of the present disclosure, through the conductive connection pattern, it is able to electrically connect the separate portions of the mask pattern to each other and prevent the occurrence of ESD between the separate portions of the mask pattern due to the accumulated electrostatic charges, thereby to prevent a display panel from being adversely affected by the ESD, and improve the performance and the yield of the display panel.

In a possible embodiment of the present disclosure, the conductive connection pattern includes a plurality of conductive connection lines intersecting each other. A distance between the adjacent conductive connection lines is smaller than a minimum distance between the separate portions of the mask pattern to enable any two separate portions of the mask pattern to be electrically connected to each other through the conductive connection line. The plurality of conductive connection lines intersects each other at a right angle, or at any other angles.

According to the embodiments of the present disclosure, a general-purpose conductive connection pattern is provided and may be adapted to any mask pattern, i.e., it is unnecessary to design different conductive connection patterns for different mask patterns. Hence, it is simple and efficient, and able to remarkably reduce the burden of the design staff.

In a possible embodiment of the present disclosure, the conductive connection pattern includes a transparent conductive layer electrically connected to the mask pattern. The transparent conductive layer may cover the mask pattern or be arranged between the mask pattern and the base substrate.

In the context, the term "transparent" refers to a situation where a light beam from a light source of a photoetching machine cooperating with the photoetching mask plate is transparent, so the transparent conductive layer has no influence on a final pattern formed on the display panel through the photoetching process. Due to the use of the transparent conductive layer as the conductive connection pattern, it is able to design and manufacture the photoetching mask plate in a simpler and more efficient manner.

In a possible embodiment of the present disclosure, the transparent conductive layer is made of conductive oxides. For example, the conductive oxides may include one or more of indium tin oxide (ITO), aluminium-doped zinc oxide (AZO), indium-doped zinc oxide (IZO) and indium-doped cadmium oxide. ITO or indium-doped tin oxide is generally believed to be the best and the most widely-used transparent conductive oxide, and it may be easily deposited to form a thin film.

In a possible embodiment of the present disclosure, the conductive connection pattern is created from an identical layer and an identical material to the mask pattern. The connection pattern and the mask pattern may be formed at same time and through a single patterning process, thereby simplifying the design and the manufacture of the photoetching mask plate.

In a possible embodiment of the present disclosure, a maximum line width of the conductive connection line is smaller than a resolution of the photoetching machine cooperating with the photoetching mask plate. The resolution of the photoetching machine is associated with a width of the finest line capable of being formed by the photoetching machine, and it is limited by the light source, a photoetching system, a photoresist and a process parameter. A common contact-type photoetching machine has a resolution at a micron scale. Hence, the conductive connection line may have a maximum line width less than 0.5 µm.

According to the embodiments of the present disclosure, the maximum line width of the conductive connection line is smaller than the resolution of the photoetching machine, so after the photoetching process, the display panel merely includes a pattern corresponding to the mask pattern, without any pattern corresponding to the conductive connection line. Hence, although with the conductive connection line on the photoetching mask plate, the final pattern on the display panel will not be adversely affected, and meanwhile the occurrence of the ESD may be prevented.

In a possible embodiment of the present disclosure, the conductive connection pattern and the mask pattern are each made of chromium.

In another aspect, the present disclosure provides in some embodiments a photoetching method using the above-mentioned photoetching mask plate. As mentioned above, through the conductive connection pattern, it is able to electrically connect the separate portions of the mask pattern to each other and prevent the occurrence of ESD between the separate portions of the mask pattern due to the accumulated electrostatic charges, thereby to prevent the display panel from being adversely affected by the ESD during the photoetching process, and improve the performance and the yield of the display panel.

In yet another aspect, the present disclosure provides in some embodiments a method for manufacturing a photoetching mask plate, including steps of: providing a base substrate; forming a mask pattern on a surface of the base substrate; and forming a conductive connection pattern on the surface of the base substrate. The conductive connection pattern is configured to electrically connect separate portions of the mask pattern to each other.

According to the embodiments of the present disclosure, through the conductive connection pattern, it is able to electrically connect the separate portions of the mask pattern to each other and prevent the occurrence of ESD between the separate portions of the mask pattern due to the accumulated electrostatic charges, thereby to prevent the display panel from being adversely affected by the ESD during the photoetching process, and improve the performance and the yield of the display panel.

In a possible embodiment of the present disclosure, the step of forming the conductive connection pattern on the surface of the base substrate includes forming a plurality of conductive connection lines intersecting each other on the surface of the base substrate. A distance between the adjacent conductive connection lines is smaller than a minimum distance between the separate portions of the mask pattern, to enable any two separate portions of the mask pattern to be electrically connected to each other through the conductive connection line. The plurality of conductive connection lines intersects each other at a right angle, or at any other angles.

According to the embodiments of the present disclosure, a general-purpose conductive connection pattern is provided and may be adapted to any mask pattern, i.e., it is unnecessary to design different conductive connection patterns for different mask patterns. Hence, it is able to remarkably simplify the design of the conductive connection pattern.

In a possible embodiment of the present disclosure, the step of forming the conductive connection pattern on the surface of the base substrate includes forming a transparent conductive layer electrically connected to the mask pattern on the surface of the base substrate. For example, the transparent conductive layer is formed on the base substrate, and then the mask pattern is formed on the transparent conductive layer. For another example, the transparent conductive layer covers the base substrate on which the mask pattern is formed. The transparent conductive layer has no influence on a final pattern formed on the display panel through the photoetching process. Due to the use of the transparent conductive layer as the conductive connection pattern, it is able to design and manufacture the photoetching mask plate in a simpler and more efficient manner.

In a possible embodiment of the present disclosure, the conductive connection pattern and the mask pattern are formed through a single patterning process, to simplify the design and the manufacture of the photoetching mask plate.

It should be appreciated that, the implementations and the advantages of the method for manufacturing the photoetching mask plate and the photoetching method may refer to those of the photoetching mask plate, and thus will not be particularly defined herein.

The above and any other aspects of the present disclosure will become more apparent from, and will be described with reference to, the following embodiments.

DETAILED DESCRIPTION

Figure 1:
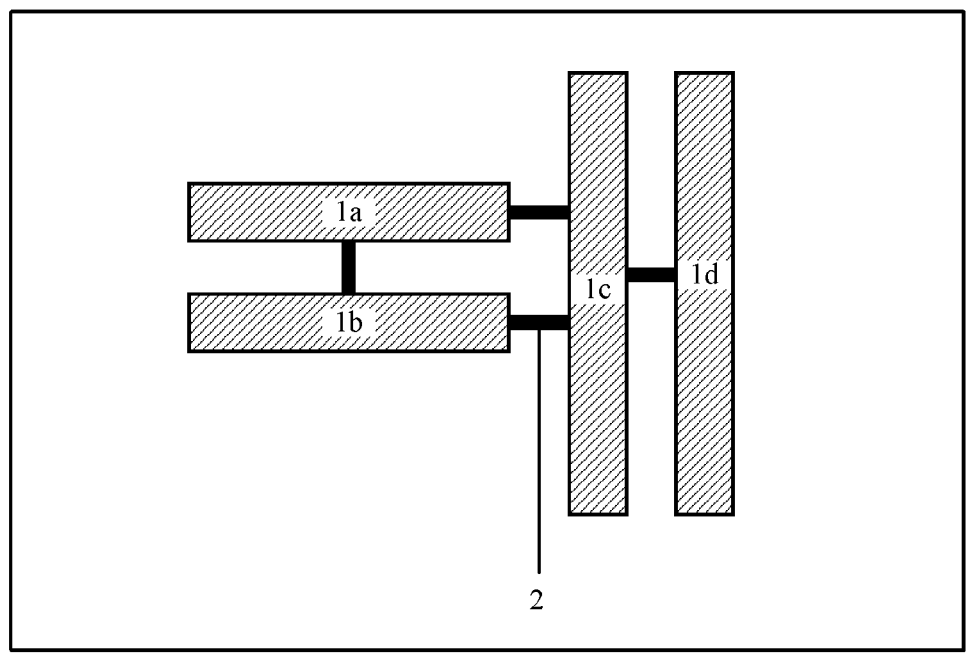
FIG. 1 is a top view of a photoetching mask plate according to one embodiment of the present disclosure.

The present disclosure will be described hereinafter in conjunction with the drawings and embodiments. Shapes and sizes of the members in the drawings are for illustrative purposes only, but shall not be used to reflect any actual scale. In the drawings, an identical reference sign represents an identical or similar member. In order to clarify the technical solution of the present disclosure, any known process steps or members will be omitted.

As shown in FIG. 1, which is a top view of a photoetching mask plate according to one embodiment of the present disclosure, the photoetching mask plate includes a mask pattern arranged on a top surface of a base substrate (not shown), and a conductive connection pattern 2 arranged on the top surface of the base substrate. The conductive connection pattern 2 is configured to electrically connect separate portions 1a, 1b, 1c and 1d of the mask pattern to each other.

According to the embodiments of the present disclosure, through the conductive connection pattern 2, it is able to electrically connect the separate portions 1a, 1b, 1c and 1d of the mask pattern to each other and prevent the occurrence of ESD between the separate portions of the mask pattern due to the accumulated electrostatic charges, thereby to prevent a display panel from being adversely affected by the ESD, and improve the performance and the yield of the display panel.

Figure 2:
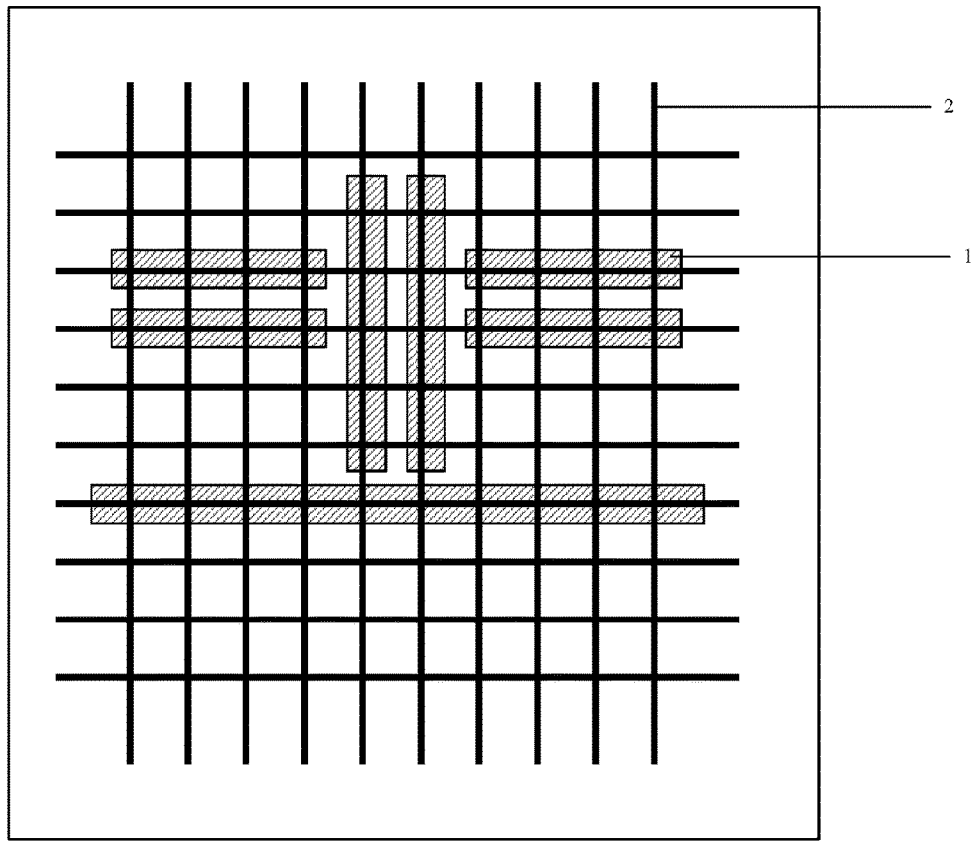
FIG. 2 is another top view of the photoetching mask plate according to one embodiment of the present disclosure.

In the embodiment as shown in FIG. 1, it is necessary for a designer to design the conductive connection pattern in accordance with the mask pattern. In the case of a very complex mask pattern, the designer's workload may increase, and human errors may occur due to fatigue. To overcome this drawback, a general-purpose conductive connection pattern is provided. As shown in FIG. 2, which is another top view of the photoetching mask plate according to one embodiment of the present disclosure, the conductive connection pattern 2 includes a plurality of conductive connection lines intersecting each other. A distance between the adjacent conductive connection lines is smaller than a minimum distance between the separate portions of the mask pattern, so as to enable any two separate portions of the mask pattern 1 to be electrically connected to each other through the conductive connection line. The plurality of conductive connection lines intersects each other at a right angle as shown in FIG. 2, or at any other angles.

According to the embodiment of the present disclosure, through the general-purpose conductive connection pattern capable of being adapted to any mask pattern, it is unnecessary to design different conductive connection patterns for different mask patterns. Hence, it is able to remarkably simplify the design of the conductive connection pattern.

It should be appreciated that, although the conductive connection lines in FIG. 2 are separated from each other at an identical interval and have an identical width, they may be designed in accordance with the practical need, as long as the separate portions of the mask pattern may be electrically connected to each other.

Figure 3:
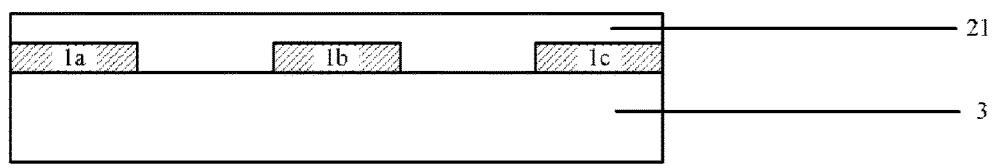
FIG. 3 is a sectional view of the photoetching mask plate according to one embodiment of the present disclosure.
Figure 4:
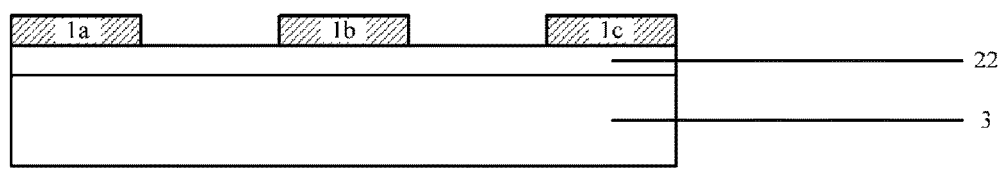
FIG. 4 is another sectional view of the photoetching mask plate according to one embodiment of the present disclosure.

In a possible embodiment of the present disclosure, the conductive connection pattern includes a transparent conductive layer electrically connected to the mask pattern. For example, as shown in FIG. 3, the transparent conductive layer 21 covers the mask pattern to electrically connect the separate portions 1*a*, 1*b* and 1*c* of the mask pattern to each other. For another example, as shown in FIG. 4, the transparent conductive layer 22 is arranged between the mask pattern and the base substrate 3 to electrically connect the separate portions 1*a*, 1*b* and 1*c* to each other. Due to the use of the transparent conductive layer as the conductive connection pattern, it is able to design and manufacture the photoetching mask plate in a simpler and more efficient manner.

The transparent conductive layer may be made of one or more conductive oxides, for example, ITO, AZO, IZO and indium-doped cadmium oxide.

Specially, the conductive connection pattern is created from an identical layer and an identical material to the mask pattern. For example, the conductive connection pattern and the mask pattern may be each made of chromium, to design and manufacture the photoetching mask plate in a simpler and more efficient manner.

For the photoetching mask plate in FIGS. 1 and 2, a maximum line width of the conductive connection line is smaller than a resolution of a photoetching machine cooperating with the photoetching mask plate. For example, the conductive connection line has a maximum line width less than 0.5 µm.

According to the embodiments of the present disclosure, the maximum line width of the conductive connection line is smaller than the resolution of the photoetching machine, so after the photoetching process, the display panel merely includes a pattern corresponding to the mask pattern, without any pattern corresponding to the conductive connection line. Hence, although with the conductive connection line on the photoetching mask plate, the final pattern on the display panel will not be adversely affected, and meanwhile the occurrence of the ESD may be prevented.

The present disclosure further provides a photoetching method using the above-mentioned photoetching mask plate. As mentioned above, through the conductive connection pattern, it is able to electrically connect the separate portions of the mask pattern to each other and prevent the occurrence of ESD between the separate portions of the mask pattern due to the accumulated electrostatic charges, thereby to prevent the display panel from being adversely affected by the ESD during the photoetching process, and improve the performance and the yield of the display panel.

Figure 5:
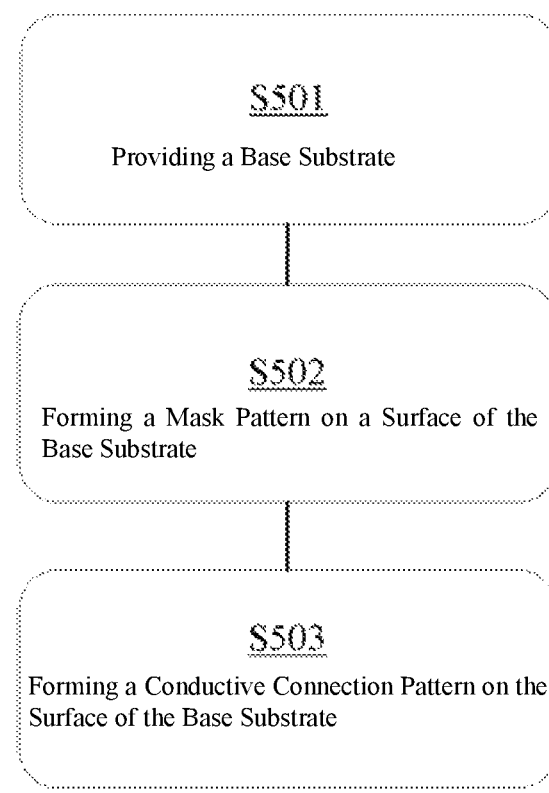
FIG. 5 is a flow chart of a method for manufacturing the photoetching mask plate according to one embodiment.

The present disclosure further provides in some embodiments a method for manufacturing a photoetching mask plate which, as shown in FIG. 5, includes the following steps. Step S501: providing a base substrate. Here, the base substrate may be any common transparent base substrate such as a glass substrate or a sapphire substrate. Step S502: forming a mask pattern on a surface of the base substrate. The mask pattern corresponds to a photoetching pattern to be formed on a display panel. Step S503: forming a conductive connection pattern on the surface of the base substrate. The conductive connection pattern is configured to electrically connect separate portions of the mask pattern.

It should be appreciated that, the above Step S502 may be performed prior to or subsequent to Step S503, or simultaneously. In the case that Steps S502 and S503 are performed simultaneously, the conductive connection pattern and the mask pattern may be formed through a single patterning process, so as to design and manufacture the photoetching mask plate in a simpler and more efficient manner.

According to the embodiments of the present disclosure, through the conductive connection pattern, it is able to electrically connect the separate portions of the mask pattern to each other and prevent the occurrence of ESD between the separate portions of the mask pattern due to the accumulated electrostatic charges, thereby to prevent the display panel from being adversely affected by the ESD during the photoetching process, and improve the performance and the yield of the display panel.

In a possible embodiment of the present disclosure, the step of forming the conductive connection pattern on the surface of the base substrate includes forming a plurality of conductive connection lines intersecting each other on the surface of the base substrate. A distance between the adjacent conductive connection lines is smaller than a minimum distance between the separate portions of the mask pattern, so as to enable any two separate portions of the mask pattern to be electrically connected to each other through the conductive connection line. The plurality of conductive connection lines intersects each other at a right angle, or at any other angles.

In a possible embodiment of the present disclosure, the step of forming the conductive connection pattern on the surface of the base substrate includes forming a transparent conductive layer electrically connected to the mask pattern on the surface of the base substrate. For example, the transparent conductive layer is formed on the base substrate, and then the mask pattern is formed on the transparent conductive layer. For another example, the transparent conductive layer covers the base substrate on which the mask pattern is formed. The transparent conductive layer has no influence on a final pattern formed on the display panel through the photoetching process. Due to the use of the transparent conductive layer as the conductive connection pattern, it is able to design and manufacture the photoetching mask plate in a simpler and more efficient manner.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A photoetching mask plate, comprising a base substrate, a mask pattern arranged on a surface of the base substrate, and a conductive connection pattern arranged on the surface of the base substrate, wherein the conductive connection pattern is configured to electrically connect separate portions of the mask pattern to each other; wherein the conductive connection pattern is a planar structure including a plurality of conductive paths, wherein at least two of the conductive paths intersect each other.

2. The photoetching mask plate according to claim 1, wherein the conductive connection pattern comprises a plurality of conductive connection lines intersecting each other.

3. The photoetching mask plate according to claim 1, wherein the conductive connection pattern comprises a transparent conductive layer electrically connected to the mask pattern.

4. The photoetching mask plate according to claim 3, wherein the transparent conductive layer covers the mask pattern.

5. The photoetching mask plate according to claim 3, wherein the transparent conductive layer is arranged between the mask pattern and the base substrate.

6. The photoetching mask plate according to claim 3, wherein the transparent conductive layer is made of a conductive oxide.

7. The photoetching mask plate according to claim 6, wherein the conductive oxide is one or more selected from the group consisting of indium tin oxide (ITO), aluminium-doped zinc oxide (AZO), indium-doped zinc oxide (IZO) or indium-doped cadmium oxide.

8. The photoetching mask plate according to claim 2, wherein each conductive connection line has a maximum line width smaller than a resolution of a photoetching machine cooperating with the photoetching mask plate.

9. The photoetching mask plate according to claim 8, wherein the maximum line width of the conductive connection line is smaller than 0.5 µm.

10. The photoetching mask plate according to claim 8, wherein the conductive connection pattern and the mask pattern are each made of chromium.

11. A photoetching method using the photoetching mask plate according to claim 1.

12. The photoetching mask plate according to claim 1, wherein the conductive connection pattern is a planar grid structure including a plurality of conductive paths.

13. The photoetching mask plate according to claim 12, wherein the conductive connection pattern comprises a plurality of conductive connection lines directly intersecting each other; a distance between adjacent ones of the plurality of conductive connection lines is smaller than a minimum distance between the separate portions of the mask pattern.

14. The photoetching mask plate according to claim 13, wherein the plurality of conductive connection lines intersects each other at a right angle.

15. A method for manufacturing a photoetching mask plate, comprising steps of:
  providing a base substrate;
  forming a mask pattern on a surface of the base substrate; and
  forming a conductive connection pattern on the surface of the base substrate, wherein the conductive connection pattern is a planar structure including a plurality of conductive paths, wherein at least two of the conductive paths intersect each other;
  wherein the conductive connection pattern is configured to electrically connect separate portions of the mask pattern to each other.

16. The method according to claim 15, wherein the step of forming the conductive connection pattern on the surface of the base substrate comprises forming a plurality of conductive connection lines intersecting each other on the surface of the base substrate.

17. The method according to claim 15, wherein the step of forming the conductive connection pattern on the surface of the base substrate comprises forming a transparent conductive layer electrically connected to the mask pattern on the surface of the base substrate.

18. The method according to claim 15, wherein the conductive connection pattern and the mask pattern are formed simultaneously through a single patterning process.

19. The method according to claim 15, wherein the conductive connection pattern is a planar grid structure including a plurality of conductive paths.

20. The method according to claim 19, wherein the conductive connection pattern comprises a plurality of conductive connection lines directly intersecting each other; a distance between adjacent ones of the plurality of conductive connection lines is smaller than a minimum distance between the separate portions of the mask pattern.

* * * * *